United States Patent
Kim

(10) Patent No.: US 9,412,968 B2
(45) Date of Patent: Aug. 9, 2016

(54) DISPLAY DEVICE HAVING A SPACER

(75) Inventor: Han-Soo Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 811 days.

(21) Appl. No.: 13/450,927

(22) Filed: Apr. 19, 2012

(65) Prior Publication Data

US 2012/0313123 A1    Dec. 13, 2012

(30) Foreign Application Priority Data

Jun. 9, 2011 (KR) .................. 10-2011-0055705

(51) Int. Cl.
*H01L 29/20* (2006.01)
*H01L 33/00* (2010.01)
*H01L 51/52* (2006.01)
*H01L 27/32* (2006.01)

(52) U.S. Cl.
CPC .......... *H01L 51/525* (2013.01); *H01L 27/3246* (2013.01); *H01L 27/3211* (2013.01)

(58) Field of Classification Search
USPC ............ 257/59, 72, 81, 89, 88; 313/504, 506, 313/512, 505
See application file for complete search history.

(56) References Cited

U.S. PATENT DOCUMENTS

| | | | |
|---|---|---|---|
| 7,792,489 B2 * | 9/2010 | Hirakata et al. | 455/25 |
| 2005/0140281 A1 * | 6/2005 | Park | 313/505 |
| 2009/0058294 A1 | 3/2009 | Joo et al. | |
| 2010/0171416 A1 * | 7/2010 | Lee | 313/504 |
| 2011/0050645 A1 | 3/2011 | Lee et al. | |

FOREIGN PATENT DOCUMENTS

| | | |
|---|---|---|
| CN | 1638548 A | 7/2005 |
| KR | 10-2010-0022738 | 3/2010 |
| KR | 10-2010-0081772 | 7/2010 |
| KR | 10-0989133 | 10/2010 |

OTHER PUBLICATIONS

Chinese Office Action issued by Chinese Patent Office on Sep. 28, 2015 in connection with Chinese Patent Application No. 201210157989.8.

* cited by examiner

*Primary Examiner* — Errol Fernandes
(74) *Attorney, Agent, or Firm* — Robert E. Bushnell, Esq.

(57) ABSTRACT

A display device includes a first substrate having a plurality of pixel regions separated by a non-pixel region; a second substrate facing the first substrate; and a spacer disposed between the first substrate and the second substrate to maintain a gap between the first substrate and the second substrate. The pixel regions include a first pixel region and a second pixel region which neighbor each other, the non-pixel region between the first pixel region and the second pixel region is bisected into a first non-pixel region adjacent to the first pixel region and a second non-pixel region adjacent to the second pixel region, and the spacer is formed on the non-pixel region between the first pixel region and the second pixel region. An area of the first non-pixel region occupied by the spacer is smaller than an area of the second non-pixel region occupied by the spacer.

19 Claims, 6 Drawing Sheets

DISPLAY DEVICE HAVING A SPACER

CLAIM OF PRIORITY

This application makes reference to, incorporates the same herein, and claims all benefits accruing under 35 U.S.C. §119 from an application earlier filed in the Korean Intellectual Property Office on 9 Jun. 2011 and there duly assigned Serial No. 10-2011-0055705.

BACKGROUND OF THE INVENTION

1. Field of the Invention

An embodiment of the present invention relates to a display device, and more particularly, to a display device unaffected by external impacts.

2. Description of the Related Art

Because of the rapid development of the information technology (IT) industry, the demand for display devices dramatically increases. Recently, display devices have been required to have lighter weight and thinner thickness, and to consume lower power and to provide higher display resolution. In order to meet these requirements, liquid crystal display devices (LCDs) and organic light-emitting display devices using organic light-emitting characteristics are being developed.

Since mobile devices, such as smart phones, are used in more diverse environments with increased frequency and for longer periods of time, external impacts may be frequently applied to the mobile devices. For example, when the mobile devices are dropped while being in use, a sudden external impact may be applied to the mobile devices. Therefore, mobile devices should have more sufficient durability, and their display properties should not be degraded by the external impacts applied, for example, when the mobile devices are dropped while being in use.

SUMMARY OF THE INVENTION

Aspects of the present invention provide an organic light-emitting display device whose display properties are not degraded even by external impacts greater than a certain magnitude.

Aspects of the present invention are however not restricted to the one set forth herein. The above and other aspects of the present invention will become more apparent to one of ordinary skill in the art to which the present invention pertains by referencing the detailed description of the present invention given below.

In accordance with an aspect of the present invention, a display device may include a first substrate having a plurality of pixel regions separated by a non-pixel region; a second substrate spaced apart from and facing the first substrate; and a spacer disposed between the first substrate and the second substrate to maintain a gap between the first substrate and the second substrate. The pixel regions include a first pixel region and a second pixel region which neighbor each other, the non-pixel region disposed between the first pixel region and the second pixel region is bisected into a first non-pixel region adjacent to the first pixel region and a second non-pixel region adjacent to the second pixel region, and the spacer is formed on the non-pixel region disposed between the first pixel region and the second pixel region. An area of the first non-pixel region occupied by the spacer is smaller than an area of the second non-pixel region occupied by the spacer.

In accordance with another aspect of the present invention, a display device may include a first substrate having a plurality of pixel regions separated by a non-pixel region; a second substrate spaced apart and facing the first substrate; and a spacer disposed between the first substrate and the second substrate to maintain a gap between the first substrate and the second substrate. The pixel regions include a first pixel region and a second pixel region which neighbor each other, and the spacer is formed on the non-pixel region between the first pixel region and the second pixel region. A distance from the spacer to the first pixel region is greater than a distance from the spacer to the second pixel region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

Hereinafter, embodiments of the present invention will be described with reference to the attached drawings.

Figure 1:
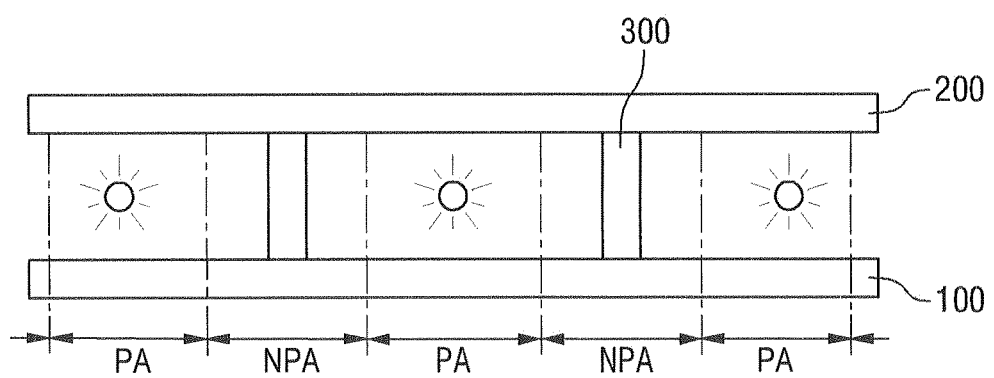
FIG. 1 is a schematic cross sectional view of a display device constructed with an embodiment of the present invention.
Figure 2:
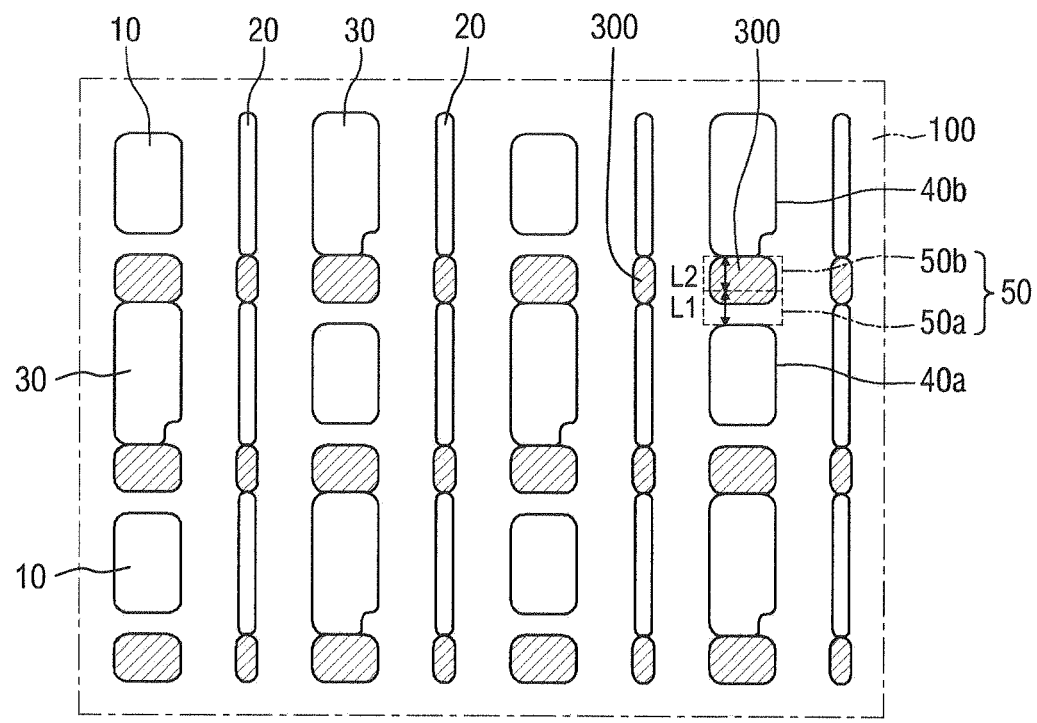
FIG. 2 is a partial plan view of the display device shown in FIG. 1.

FIG. 1 is a schematic cross sectional view of a display device constructed with an embodiment of the present invention. FIG. 2 is a partial plan view of the display device shown in FIG. 1.

Referring to FIGS. 1 and 2, the display device includes a first substrate 100, a second substrate 200 facing the first substrate 100, and spacers 300 separating the first substrate 100 and the second substrate 200.

The first substrate 100 includes a non-pixel region NPA and a plurality of pixel regions PA separated by the non-pixel region NPA.

The non-pixel region NPA may be a non-light-emitting region in which no light is seen. Therefore, a light-emitting structure for emitting light may not be implemented in the non-pixel region NPA. In some embodiments, even though the non-light-emitting region NPA may at least partially include the light-emitting structure for emitting light, light emission may be blocked by a light-blocking structure in the non-pixel region NPA.

Each of the pixel regions PA may be a light-emitting region in which light can be seen, and the pixel regions may include a light-emitting structure. For example, each of the pixel regions PA may include a stacked layer of organic materials for organic light emission. The pixel regions PA may be arranged in a matrix.

In some embodiments, the pixel regions PA may include a red pixel region 10 which emits red light, a green pixel region 20 which emits green light, and a blue pixel region 30 which emits blue light. The red pixel region 10, the green pixel region 20, and the blue pixel region 30 may be repeatedly arranged in a certain pattern. In FIG. 2, an example of a pattern in which the red pixel region 10, the green pixel region 20 and the blue pixel region 30 are arranged is illustrated. The present invention is however not limited to the exemplary pattern as shown in FIG. 2.

Referring to FIG. 2, the red pixel region 10 and the blue pixel region 30 are alternately arranged along a column direction in each odd-numbered column. The red pixel region 10 and the blue pixel region 30 in each odd-numbered column are arranged in the reverse order to those in a neighboring odd-numbered column. Such arrangement of the red pixel region 10 and the blue pixel region 30 in an odd-numbered column is repeated along a row direction. The green pixel region 20 is repeated in each even-numbered column.

In addition, the red pixel region 10, the green pixel region 20, the blue pixel region 30 and the green pixel region 20 are repeatedly arranged in such an order along the row direction in each odd-numbered row. The blue pixel region 30, the green pixel region 20, the red pixel region 10 and the green pixel region 20 are repeatedly arranged in such an order along the row direction in each even-numbered row.

Referring back to FIGS. 1 and 2, the second substrate 200 is disposed over the first substrate 100 to face the first substrate 100, and one or more spacers 300 are interposed between the first substrate 100 and the second substrate 200 to separate the first substrate 100 and the second substrate 200. The spacers 300 are placed on the non-pixel region NPA of the first substrate 100. In some embodiments, a plurality of spacer 300 are provided, and each spacer 300 is disposed between two pixel regions PA which neighbor each other in the column direction, as shown in FIG. 2. For ease of description, as shown in FIG. 2, any one of the two pixel regions PA which neighbor each other in the column direction is referred to as a first pixel region 40a, and the other one is referred to as a second pixel region 40b.

The non-pixel region NPA 50 between the first pixel region 40a and the second pixel region 40b is bisected into a first non-pixel region 50a adjacent to the first pixel region 40a and a second non-pixel region 50b adjacent to the second pixel region 40b. Here, the term "bisected" denotes that the non-pixel region NPA 50 disposed between the first pixel region 40a and the second pixel region 40b is divided into two equal areas. In some embodiments, a boundary between the first pixel region 40a and the first non-pixel region 50a may be substantially parallel to a boundary between the second pixel region 40b and the second non-pixel region 50b. In this case, a boundary between the first non-pixel region 50a and the second non-pixel region 50b may also be substantially parallel to the boundary between the first pixel region 40a and the first non-pixel region 50a. In addition, a distance L1 from the boundary between the first non-pixel region 50a and the second non-pixel region 50b to the first pixel region 40a may be substantially equal to a distance L2 from the boundary between the first non-pixel region 50a and the second non-pixel region 50b to the second pixel region 40b.

Each spacer 300 is placed on the first and second non-pixel regions 50a and 50b between the first pixel region 40a and the second pixel region 40b. Here, an area of the first non-pixel region 50a occupied by each spacer 300 may be smaller than that of the second non-pixel region 50b occupied by each spacer 300.

In some embodiments, the area of the first non-pixel region 50a occupied by each spacer 300 may be zero. This indicates that each spacer 300 is formed only on the second non-pixel region 50b among the first non-pixel region 50a and the second non-pixel region 50b.

In the embodiment of FIG. 2, each spacer 300 is separated from the first pixel region 40a. That is, in FIG. 2, each spacer 300 is adjacent to the second pixel region 40b but is separated from the first pixel region 40a. Each spacer 300 may be spaced apart from the first pixel region 40a. Thus, the area of the first non-pixel region 50a occupied by each spacer 300 is smaller than that of the second non-pixel region 50b occupied by each spacer 300.

When the area of the first non-pixel region 50a occupied by each spacer 300 is smaller than that of the second non-pixel region 40b occupied by each spacer 300, each spacer 300 may have less effect on the first pixel region 40a than on the second pixel region 40b.

Specifically, referring to FIG. 1, each spacer 300 maintains a gap between the first substrate 100 and the second substrate 200. Each spacer 300 however may be bent in a vertical direction or a direction oblique to the vertical direction by external impact. Here, if each spacer 300 partially contacts an adjacent pixel region PA of the first substrate 100 or a region of the substrate 200 which corresponds to the adjacent pixel region PA, components of each spacer 300 or materials coated on each spacer 300 may remain on the adjacent pixel region PA of the first substrate 100 or the region of the second substrate 200 which corresponds to the adjacent pixel region PA. In this case, the remaining components of each spacer 300 or the remaining materials coated on each spacer 300 may act as foreign matter, thereby limiting or distorting light emission of the adjacent pixel region PA.

Referring to FIG. 2, each spacer 300 is located more in the second non-pixel region 50b adjacent to the second pixel region 40b than in the first non-pixel region 50a adjacent to the first pixel region 40a. Thus, the first pixel region 40a has a lower probability that foreign matter originating from each spacer 300 will remain thereon than the second pixel region 40b. Consequently, the probability that light emission is limited or distorted by each spacer 300 may be relatively reduced at least in the first pixel region 40a.

That is, as long as a minimum cross-section of each spacer 300 to maintain the strength to support the first substrate 100 and the second substrate 200 is maintained, the amounts of foreign matter which may be transferred onto the first pixel region 40a and the second pixel region 40b can be selectively adjusted. For example, when the limitation of light emission or color distortion due to transferred foreign matter is more severe in the first pixel region 40a than in the second pixel region 40b, each spacer 300 may be placed closer to the second pixel region 40b such that the amount of foreign matter transferred to the second pixel region 40b is greater than that of foreign matter transferred to the first pixel region 40a.

In some display devices, the red pixel region 10 is more vulnerable to the limitation of light emission than other pixel regions PA, e.g., the blue pixel region 30. That is, even when foreign matter exists on an equal area of each pixel region PA, a reduction in luminance due to the foreign matter is greater in the red pixel region 10 than in the blue pixel region 30. From this perspective, if the red pixel region 10 is applied to the first pixel region 40a and if the blue pixel region 30 is applied to the second pixel region 40b, since the red pixel region 10 has a relatively lower probability of light emission limitation or distortion due to each spacer 300, the deterioration of image quality resulting from a reduction in the overall luminance may be minimized.

In one embodiment, the green pixel region may be applied to the second pixel region and the red pixel region may be applied to the first pixel region.

Figure 3:
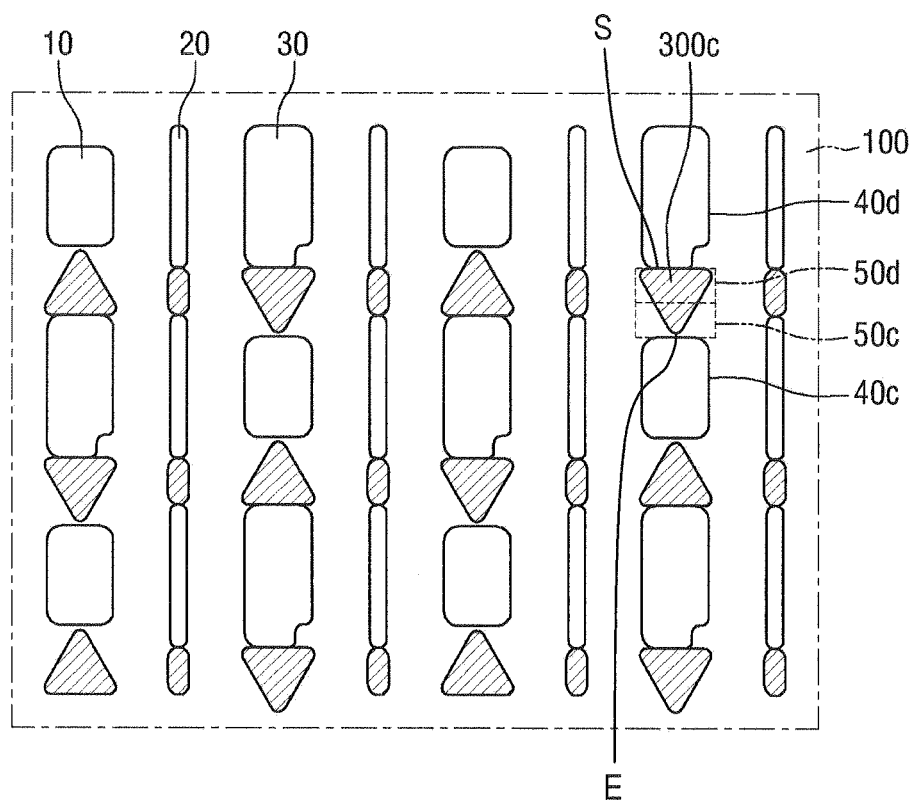
FIG. 3 is a partial plan view of a display device constructed with another embodiment of the present invention.

FIG. 3 is a partial plan view of a display device constructed with another embodiment of the present invention.

Referring to FIG. 3, the display device constructed with the current embodiment is different from the display device constructed with the previous exemplary embodiment in that the current embodiment includes spacers 300c shaped like triangular prisms. Hereinafter, elements substantially identical to those of the previous embodiment are indicated by like reference numerals, and thus a repetitive description thereof will be omitted.

Each spacer 300c shaped like a triangular prism is disposed on first and second non-pixel regions 50c and 50d adjacent to neighboring first and second pixel regions 40c and 40d, respectively. An edge E of the triangular prism is adjacent to the first pixel region 40c, and a side S disposed opposite to the edge E of the triangular prism is adjacent to the second pixel region 40d. In this case, an area of the first non-pixel region 50c occupied by each triangular prism-shaped spacer 300c is smaller than that of the second non-pixel region 50d occupied by each spacer 300c.

That is, while the difference between the area of the first non-pixel region 50a occupied by each spacer 300 and the area of the second non-pixel region 50b occupied by each spacer 300 is achieved by placing each spacer 300 at different distances from the first pixel region 40a and the second pixel region 40b in FIG. 2, the difference between the area of the first non-pixel region 50c occupied by each spacer 300c and the area of the second non-pixel region 50d occupied by each spacer 300c is achieved even though each spacer 300c is located at an equal distance from the first pixel region 40c and the second pixel region 40d in FIG. 3.

The shape of each spacer 300 constructed with the present invention is not limited to a prism and a triangular prism shown in FIGS. 2 and 3. Each spacer may have various shapes that make the spacer located at different distances from the first pixel region 40c and the second pixel region 40d or make the spacer occupy different sized areas of the first non-pixel region 50c and the second non-pixel region 50d, thereby controlling the amounts of foreign matter transferred to the first pixel region 40c and the second pixel region 40d under the external impact. For example, each spacer may be shaped like a prismoid, a cylinder, a prism, a dome, or a spheroid.

Figure 4:
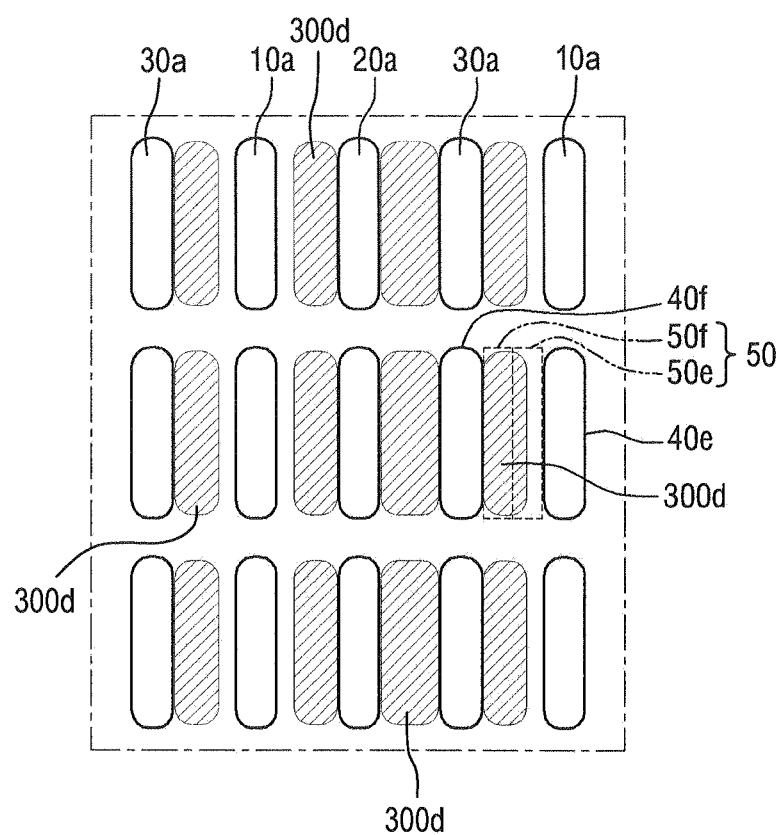
FIG. 4 is a partial plan view of a display device constructed with another embodiment of the present invention.

FIG. 4 is a partial plan view of a display device constructed with another embodiment of the present invention.

Referring to FIG. 4, the display device constructed with the current exemplary embodiment is different from the display device constructed with the previous exemplary embodiment of FIG. 1 in the arrangement of a plurality of pixel regions and the position of one or more spacers 300d. Hereinafter, elements substantially identical to those of the previous embodiment of FIG. 1 are indicated by like reference numerals, and thus a repetitive description thereof will be omitted.

Referring to FIG. 4, a plurality of pixel regions include a red pixel region 10a which emits red light, a green pixel region 20a which emits green light, and a blue pixel region 30a which emits blue light. In a first pixel column, the blue pixel region 30a is successively repeated along a column direction. In addition, a second pixel column neighbors the first pixel column and is parallel to the first pixel column. The red pixel region 10a is successively repeated in the second pixel column. A third pixel column neighbors the second pixel column and is parallel to the second pixel column. The green pixel region 20a is successively repeated in the third pixel column.

As shown in FIG. 4, each spacer 300d is disposed between two pixel columns which neighbor each other in a row direction. For ease of description, any one of the two pixel regions which neighbor each other in the row direction is referred to as a first pixel region 40e, and the other one is referred to as a second pixel region 40f.

A non-pixel region 50 between the first pixel region 40e and the second pixel region 40f is bisected into a first non-pixel region 50e adjacent to the first pixel region 40e and a second non-pixel region 50f adjacent to the second pixel region 40f. Each spacer 300d is placed on the first and second non-pixel regions 50e and 50f between the first pixel region 40e and the second pixel region 40f. Here, an area of the first non-pixel region 50e occupied by each spacer 300d may be smaller than that of the second non-pixel region 50f occupied by each spacer 300d.

In some embodiments, the area of the first non-pixel region 50e occupied by each spacer 300d may be zero. This indicates that each spacer 300d may be formed only on the second non-pixel region 50f among the first non-pixel region 50e and the second non-pixel region 50f.

In the embodiment of FIG. 4, each spacer 300d is separated from the first pixel region 40e. That is, in FIG. 4, each spacer 300d is adjacent to the second pixel region 40f but is separated from the first pixel region 40e. Each spacer 300d may be spaced apart from the first pixel region 40e. Thus, the area of the first non-pixel region 50e occupied by each spacer 300d is smaller than that of the second non-pixel region 50f occupied by each spacer 300d.

That is, as long as a minimum cross-section of each spacer 300d to maintain the strength to support a first substrate 100 and a second substrate 200 is maintained, the amounts of foreign matter transferred onto the first pixel region 40e and the second pixel region 40f can be selectively adjusted. For example, when the limitation of light emission or color distortion due to transferred foreign matter is more severe in the second pixel region 40f than in the first pixel region 40e, each spacer 300d may be placed closer to the first pixel region 40f such that the amount of foreign matter transferred to the first pixel region 40e is greater than that of foreign matter transferred to the second pixel region 40f.

In one embodiment, the green pixel region 20a may be applied to the second pixel region 40f, and the red pixel region 10a may be applied to the first pixel region 40e.

In some display devices, the red pixel region 10a is more vulnerable to the limitation of light emission than other pixel regions PA, e.g., the blue pixel region 30a. That is, even when foreign matter exists on an equal area of each pixel region PA, a reduction in luminance due to the foreign matter is greater in the red pixel region 10a than in the blue pixel region 30a. From this perspective, if the blue pixel region 30a of the first pixel column is applied to the second pixel region 40f and if the red pixel region 10a is applied to the first pixel region 40e, since the red pixel region 10a has a relatively lower probability of light emission limitation or distortion due to each spacer 300d, the deterioration of image quality resulting from a reduction in the overall luminance can be minimized.

The display device described above is applicable to various flat panel display devices such as organic light-emitting display devices and liquid crystal display devices. Hereinafter, a case where the display device is applied to an organic light-emitting display device will be described in detail as an example.

Figure 5:
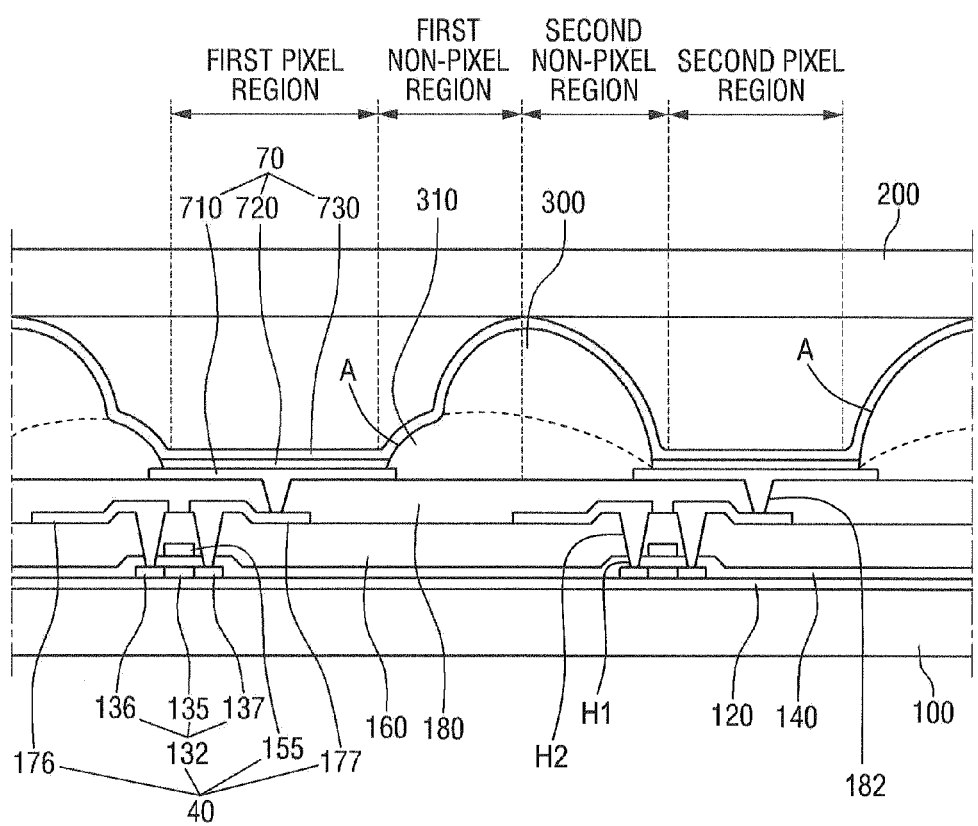
FIG. 5 is a cross-sectional view showing the structure of a display device constructed with embodiments of the present invention.
Figure 6:
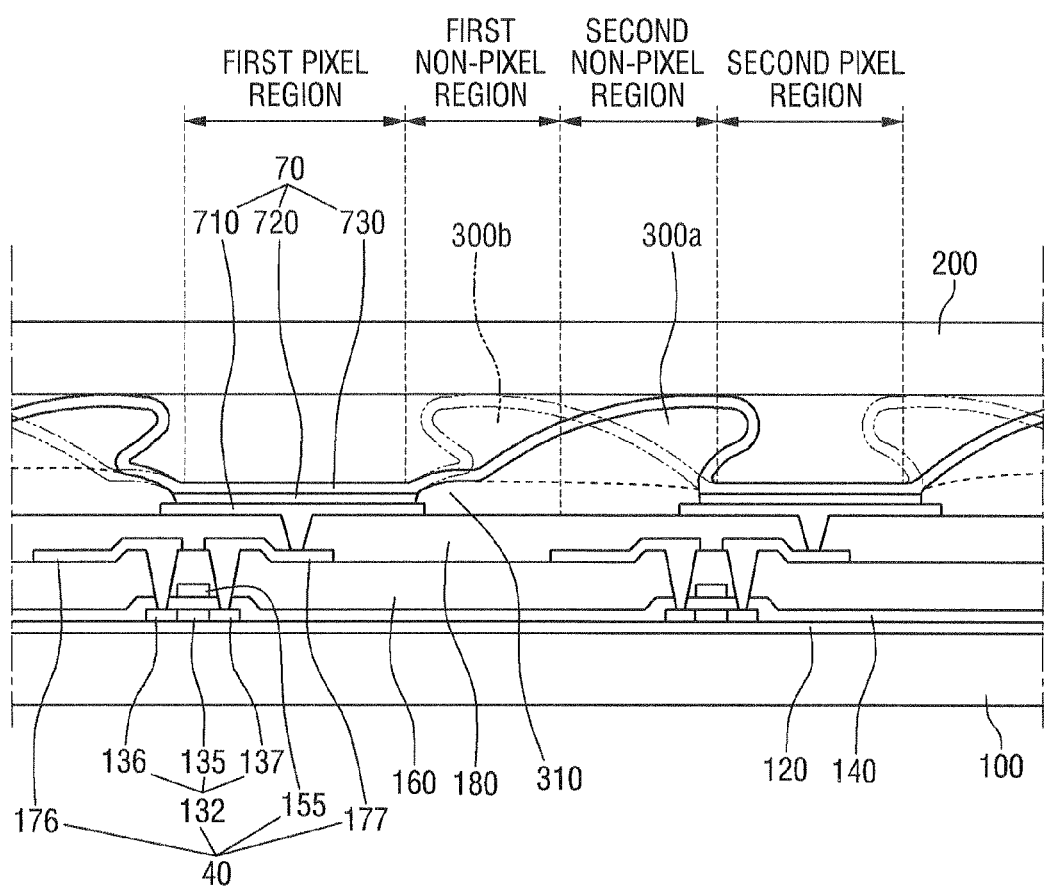
FIG. 6 is a mimetic cross-sectional view of the display device of FIG. 5 under external impacts.

FIG. 5 is a cross-sectional view of an organic light-emitting display device constructed as embodiments of the present invention. FIG. 6 is a cross-sectional view illustrating a change inside the organic light-emitting display device caused by external impact.

Referring to FIG. 5, the organic light-emitting display device constructed with the embodiments includes a first substrate 100, a second substrate 200 facing the first substrate 100, a buffer layer 120, a driving semiconductor layer 132, a gate insulating film 140, an interlayer insulating film 160, a planarization film 180, an organic light-emitting element 70, a pixel defined layer 310, a spacer 300, and various conducting wirings and electrodes.

The first substrate 100 is divided into a non-pixel region NPA and a plurality of pixel regions PA separated by the non-pixel region NPA. The first substrate 100 may be a transparent insulating substrate made of glass, quartz, ceramic, or plastic. In addition, the first substrate 100 may consist of either a single layer or multiple layers.

Various wirings and electrodes (such as data lines and gate lines) for driving the organic light-emitting display device may be formed on the first substrate 100. The wirings and electrodes formed on the first substrate 100 will be described later.

The second substrate 200 faces the first substrate 100 and seals an organic light-emitting layer 720 between the first substrate 100 and the second substrate 200 from external air. Accordingly, the present invention may further include a sealing member (not shown) which attaches and seals the first substrate 100 and the second substrate 200 together. The sealing member (not shown) may be made of one or more materials selected from the group consisting of glass, acrylic resin, methacrylic resin, polyisoprene, vinyl resin, epoxy resin, urethane resin and cellulose resin, or a compound of these materials.

The buffer layer 120 is formed on the first substrate 100. The buffer layer 120 prevents the penetration of impurity elements into the first substrate 100 and planarizes the surface of the first substrate 100. The buffer layer 120 may be made of various materials that can perform these functions. For example, the buffer layer 120 may be any one of a SiNx layer, a $SiO_2$ layer, and a SiOxNy layer. The buffer layer 120 is not essential and can be omitted depending on the type of the first substrate 100 and processing conditions.

The driving semiconductor layer 132 is formed on the buffer layer 120. The driving semiconductor layer 132 may be made of an amorphous silicon film or a polycrystalline silicon film. However, the polycrystalline silicon film is preferred. In addition, the driving semiconductor layer 132 includes a channel region which is undoped with impurities and a source region 136 and a drain region 137 which are formed on both sides of the channel region and are p+-doped. Here, an ion material used to dope the source and drain regions 136 and 137 is P-type impurities such as boron (B). In particular, $B_2H_6$ is generally used. The impurities may vary according to the type of thin-film transistor (TFT).

The gate insulating film 140 is formed of SiNx or $SiO_2$ on the driving semiconductor layer 132. A gate wiring including a driving gate electrode is formed on the gate insulating film 140. The gate wiring further includes a gate line (not shown), a first sustain electrode, and other wirings. The driving gate electrode overlaps at least part (in particular, the channel region) of the driving semiconductor layer 132.

The interlayer insulating film 160 covering the driving gate electrode is formed on the gate insulating film 140. Through holes H1 and H2 are formed in both the gate insulating film 140 and the interlayer insulating film 160 to expose the source region 136 and the drain electrode 137 of the driving semiconductor layer 132. Like the gate insulating film 140, the interlayer insulating film 160 may be made of SiNx or $SiO_2$.

A data wiring including a driving source electrode 176 and a driving drain electrode 177 is formed on the interlayer insulating film 160. The data wiring further includes a data line (not shown), a common power supply line (not shown), a second sustain electrode and other wirings. The driving source electrode 176 and the driving drain electrode 177 are connected to the source region 136 and the drain region 137 of the driving semiconductor layer 132 by the through holes H1 and H2, respectively.

In this way, a driving TFT 40 including the driving semiconductor layer 132, the driving gate electrode 155, the driving source electrode 176 and the driving drain electrode 177 is formed.

The planarization film 180 covering the data wiring is formed on the interlayer insulating film 160. The planarization film 180 planarizes steps to increase light-emitting efficiency of the organic light-emitting element 70 that is to be formed thereon.

The planarization film 180 includes a contact hole which exposes a portion of the driving drain electrode 177.

The planarization film 180 may be made of one or more materials selected from polyacrylates resin, epoxy resin, phenolic resin, polyamides resin, polyimides resin, unsaturated polyesters resin, poly phenylenethers resin, poly phenylenesulfides resin, and benzocyclobutene (BCB).

The organic light-emitting element 70 is formed on the planarization film 180 in each pixel region PA.

The organic light-emitting element 70 includes a pixel electrode 710, the organic light-emitting layer 720, and a common electrode 730 stacked sequentially. The pixel electrode 710 may be connected to the driving drain electrode 177 by the contact hole 182 of the planarization film 180.

The pixel electrode 710 and the common electrode 730 may be made of a reflective electrically conductive material, a transparent electrically conductive material, or a semi-transparent electrically conductive material.

Examples of the reflective electrically conductive material include Li, Ca, LiF/Ca, LiF/Al, Al, Ag, Mg, and Au. Examples of the transparent electrically conductive material include indium tin oxide (ITO), indium zinc oxide (IZO), ZnO, and indium oxide ($In_2O_3$).

The semi-transparent electrically conductive material may be a co-deposition material containing one or more of Mg and Ag or may be one or more of Mg, Ag, Ca, Li, and Al.

The pixel defined layer 310 includes a plurality of apertures A, each exposing the pixel electrode 710, and defines the pixel region PA of each organic light-emitting element 70 and the non-pixel region NPA. The pixel electrode 710, the organic light-emitting layer 720, and the common electrode 730 are sequentially stacked in each aperture of the pixel defined layer 310, such that the organic light-emitting layer 720 emits light. That is, a region in which the pixel defined layer 310 is formed is substantially the non-pixel region NPA, and each aperture of the pixel defined layer 310 is substantially the pixel region PA.

The spacer 300 is formed on the pixel defined layer 310. The pixel defined layer 310 and the spacer 300 may be formed as a single body by a photo process or a photolithography process using a photosensitive material. That is, the pixel defined layer 310 and the spacer 300 may be formed together in a halftone exposure process by adjusting light exposure. However, the present invention is not limited thereto, and the pixel defined layer 310 and the spacer 300 may also be formed sequentially or separately. The pixel defined layer 310 and the spacer 300 may also be independent structures made of different materials.

As described above with reference to FIGS. 1 through 4, the spacer 300 is separated from a first pixel region with the pixel defined layer 310 interposed therebetween and is located adjacent to a second pixel region. The spacer 300 may be spaced apart from the first pixel region. The spacer 300 may be located immediately adjacent to the second pixel region. Accordingly, an area of the first pixel region occupied by the spacer 300 is smaller than that of the second pixel region occupied by the spacer 300.

The deformation of the spacer 300 of FIG. 5 by external impact will now be described in greater detail with reference to FIG. 6. Referring to FIG. 6, when the external impact is applied to the display device, a gap between the first substrate 100 and the second substrate 200 may be reduced, and the first substrate 100 and the second substrate 200 may be misaligned by a certain distance in a direction parallel to a surface direction of the first substrate 100 and the second substrate 200. Here, the spacer 300 that supports the first substrate 100 and the second substrate 200 may be deformed as indicated by reference numerals 300a or 300b in FIG. 6.

The degree to which the deformed spacer 300a or 300b invades the first pixel region or the second pixel region may depend on the distance by which the spacer 300 is separated from the first pixel region or the second pixel region by the pixel defined layer 310. Referring to FIG. 6, an area of the second pixel region invaded by the spacer 300a deformed in the direction of the second pixel region is greater than an area of the first pixel region invaded by the spacer 300b deformed in the direction of the first pixel region. Accordingly, a greater amount of foreign matter such as the common electrode 730 formed on the deformed spacer 300a or 300b and the organic light-emitting layer 720 may be transferred to the second pixel region than the amount of foreign matter transferred to the first pixel region.

As described above, the deterioration of optical characteristics and the degree of light blocking due to transferred foreign matter may vary according to pixel characteristics of the first pixel region and the second pixel region. In addition, the amounts of foreign matter transferred to the first pixel region and the second pixel region may be selectively controlled by adjusting areas of the first non-pixel region and the second non-pixel region occupied by a spacer or adjusting distances from the first pixel region and the second pixel region to the spacer.

What is claimed is:

1. A display device, comprising:
a first substrate comprising a plurality of pixel regions separated by a non-pixel region;
a second substrate spaced apart from and facing the first substrate; and
a spacer disposed between the first substrate and the second substrate and maintaining a gap between the first substrate and the second substrate,
the pixel regions comprising a first pixel region and a second pixel region which neighbor each other, the first pixel region emitting light having a first color and the second pixel region emitting light having a second color different from the first color, the non-pixel region that is disposed between the first pixel region and the second pixel region being bisected into a first non-pixel region adjacent to the first pixel region and a second non-pixel region adjacent to the second pixel region,
the spacer being formed on the non-pixel region that is disposed between the first pixel region and the second pixel region, and an area of the first non-pixel region occupied by the spacer being smaller than an area of the second non-pixel region occupied by the spacer,
wherein the pixel regions comprise a plurality of red, green and blue pixel regions,
the first pixel region is one of the red pixel regions, and
the second pixel region is any one selected from one of the blue and green pixel regions.

2. The display device of claim 1, wherein a boundary between the first non-pixel region and the second non-pixel region is substantially parallel to a boundary between the first pixel region and the first non-pixel region and a boundary between the second pixel region and the second non-pixel region.

3. The display device of claim 1, wherein a shortest distance from an arbitrary point on the first non-pixel region to the first pixel region is shorter than a shortest distance from the arbitrary point to the second pixel region.

4. The display device of claim 1, wherein the spacer is separated from the first pixel region.

5. The display device of claim 4, wherein the spacer is separated from the second pixel region, and a distance from the spacer to the first pixel region is greater than a distance from the spacer to the second pixel region.

6. The display device of claim 1, wherein a distance from the spacer to a boundary of the first pixel region is different from a distance from the spacer to a boundary of the second pixel region with the boundary of the second pixel region neighboring the boundary of the first pixel region.

7. The display device of claim 6, wherein the pixel regions comprise a plurality of red, green and blue pixel regions, wherein the first pixel region is one of the red pixel regions, and the second pixel region is any one selected from the blue and green pixel regions, wherein the distance by which the spacer is separated from the boundary of the first pixel region is greater than the distance by which the spacer is separated from the boundary of the second pixel region with the boundary of the second pixel region neighboring the boundary of the first pixel region.

8. The display device of claim 1, further comprising a pixel defined layer disposed on the non-pixel region of the first substrate and comprising a plurality of apertures which expose the pixel regions, respectively.

9. The display device of claim 8, wherein the spacer protrudes from the pixel defined layer toward the second substrate.

10. The display device of claim 1, wherein the spacer is any one of a prismoid, a cylinder, a prism, a dome, and a spheroid.

11. The display device of claim 1, wherein the pixel regions comprise a plurality of red, green and blue pixel regions and are arranged in a matrix.

12. The display device of claim 11, wherein the pixel regions comprise:
a first pixel column in which the blue pixel regions are successively arranged;
a second pixel column which is parallel to the first pixel column and in which the red pixel regions are successively arranged; and
a third pixel column which is parallel to the second pixel column and in which the green pixel regions are successively arranged.

13. The display device of claim 12, wherein the first pixel region is one of the pixel regions of the second pixel column, the second pixel region is a pixel region which neighbors the first pixel region and is disposed in the first pixel column or the third pixel column, and the spacer is formed on the non-pixel region disposed between the first pixel region and the second pixel region.

14. The display device of claim 11, wherein the pixel regions comprise:
  a first pixel column in which the blue pixel regions and the red pixel regions are alternately arranged; and
  a second pixel column which is parallel to the first pixel column and in which the green pixel regions are successively arranged.

15. The display device of claim 14, wherein the first pixel region is one of the red pixel regions of the first pixel column, the second pixel region is a blue or green region which neighbors the first pixel region, and the spacer is formed on the non-pixel region between the first pixel region and the second pixel region.

16. A display device, comprising:
  a first substrate comprising a plurality of pixel regions separated by a non-pixel region;
  a second substrate spaced apart from and facing the first substrate; and
  a spacer disposed between the first substrate and the second substrate to maintain a gap between the first substrate and the second substrate,
  the pixel regions comprising a first pixel region and a second pixel region which neighbor each other,
  the spacer being formed on the non-pixel region that is disposed between the first pixel region and the second pixel region, and
  a distance from the spacer to the first pixel region being greater than a distance from the spacer to the second pixel region,
  wherein the pixel regions comprise a plurality of red, green and blue pixel regions, and
  the first pixel region is one of the red pixel regions, and
  the second pixel region is any one selected from the blue and green pixel regions.

17. The display device of claim 16, wherein the non-pixel region disposed between the first pixel region and the second pixel region is bisected into a first non-pixel region adjacent to the first pixel region and a second non-pixel region adjacent to the second pixel region, and
  the spacer occupies different sized areas of the first non-pixel region and the second non-pixel region.

18. The display device of claim 16, wherein the pixel regions comprise a plurality of red, green and blue pixel regions and are arranged in a matrix, and the pixel regions comprise:
  a first pixel column in which the blue pixel regions and the red pixel regions are alternately arranged; and
  a second pixel column which is parallel to the first pixel column and in which the green pixel regions are successively arranged.

19. The display device of claim 18, wherein the first pixel region is one of the red pixel regions of the first pixel column, the second pixel region is a blue or green region which neighbors the first pixel region, and the spacer is formed on the non-pixel region disposed between the first pixel region and the second pixel region.

* * * * *